United States Patent [19]
Anzai

[11] Patent Number: 5,881,111
[45] Date of Patent: Mar. 9, 1999

[54] FREQUENCY SWEEP CIRCUIT

[75] Inventor: Makoto Anzai, Tokyo, Japan

[73] Assignee: NEC Corporation, Tokyo, Japan

[21] Appl. No.: 791,635

[22] Filed: Jan. 31, 1997

[30] Foreign Application Priority Data

Feb. 6, 1996 [JP] Japan .................................. 8-020201

[51] Int. Cl.⁶ .............................. H03D 3/18; H03D 3/24
[52] U.S. Cl. ........................ 375/327; 375/326; 375/376; 329/309
[58] Field of Search ................................... 375/316, 326, 375/327, 376; 329/307, 309, 325, 360; 327/131; 331/4

[56] References Cited

U.S. PATENT DOCUMENTS

| | | | |
|---|---|---|---|
| 4,077,016 | 2/1978 | Sanders et al. | 331/4 |
| 4,092,606 | 5/1978 | Ryan | 329/124 |
| 4,853,642 | 8/1989 | Otani et al. | 331/4 |
| 4,871,973 | 10/1989 | Yoshihara | 375/327 |
| 5,533,059 | 7/1996 | Tsuda | 375/327 |
| 5,621,767 | 4/1997 | Brandt et al. | 375/326 |

FOREIGN PATENT DOCUMENTS 4-47838  2/1992  Japan .

OTHER PUBLICATIONS

JAPIO abstract, JP 6–216769, Jan. (1993), AN 5–021998.

*Primary Examiner*—Chi H. Pham
*Assistant Examiner*—Emmanuel Bayard
*Attorney, Agent, or Firm*—Foley & Lardner

[57] ABSTRACT

A frequency sweep circuit including: a pull-in verification wave generator for generating a verification signal for pull-in verification; a sweep wave generator for generating a frequency sweep signal; a first adder for adding an output from the pull-in verification wave generator and an output from the sweep wave generator; a correlation determining unit for receiving a phase difference signal representing a phase difference between a received carrier wave and a recovered carrier wave, and an output from the first adder, determining presence/absence of a correlation between the phase difference signal and the output, and outputting a control signal for controlling the sweep wave generator; a second adder for adding the output from the first adder to the phase difference signal; a digital-to-analog converter for receiving an output from the second adder; a loop filter for receiving an output from the digital-to-analog converter; and a voltage-controlled oscillator for receiving an output from the loop filter and generating the recovered carrier wave.

7 Claims, 5 Drawing Sheets

(a)

(b)

(c)

(d)

PHASE-UNLOCKING ← → PHASE-LOCKING (e) ref (f)

SWEEP  STOP SWEEP

FREQUENCY SWEEP CIRCUIT

BACKGROUND OF THE INVENTION

1. Field of the Invention

The present invention relates to a frequency sweep circuit and, more particularly to, a frequency sweep circuit used in a multisymbol modulator/demodulator for transmitting a digital signal.

2. Description of the Prior Art

FIG. 1 shows an example of a conventional carrier wave recovery system used in digital radio transmission.

Referring to FIG. 1, a modulated wave input from a signal input terminal IN is multiplied by a multiplier 1 with a recovered carrier wave output from a voltage-controlled oscillator 6. An unnecessary higher harmonic is removed by a low-pass filter 2 from an output signal from the multiplier 1, and the resultant signal serves as a demodulated baseband signal. Upon sampling and quantization, this signal is converted into a digital signal by an analog-to-digital converter 3. From this digital signal, a phase difference detector 4 detects a phase difference between the carrier wave and the recovered carrier wave, and outputs a control signal in accordance with the difference. The control signal is smoothed by a loop filter 5 serving as a low-pass filter and serves as a carrier wave phase control signal for the voltage-controlled oscillator 6. An analog sweep unit 7 connected in an AC manner to the control signal is an analog oscillator using part of a positive feedback loop as an input/output terminal. The analog sweep unit 7 widens the phase locking range by oscillating a sweep signal when phase locking is stepped out on the basis of the state of the control signal, or it stops the oscillation in the phase-locked state.

In the conventional carrier wave recovery circuit described above, however, since the analog oscillator is used in the main part of the frequency sweep circuit, this circuit is difficult to be mounted in an IC, and the oscillation condition easily changes. Further, the conventional circuit has problems such as the limitation of the oscillation frequency and the amplitude.

SUMMARY OF THE INVENTION

The present invention has been made in consideration of the above situation, and has as its object to provide a frequency sweep circuit which can be easily mounted on an IC, has a stable oscillation condition free from any change, and can set the oscillation frequency, the amplitude, and the like with a high degree of freedom by constituting the main part of the frequency sweep circuit with a digital circuit.

To achieve the above object, according to the basic aspect of the present invention, there is provided a frequency sweep circuit used in a multisymbol modulator/demodulator for transmitting a digital signal, comprising a pull-in verification wave generator for generating a verification signal for pull-in verification, a sweep wave generator for generating a frequency sweep signal, a first adder for adding an output from the pull-in verification wave generator and an output from the sweep wave generator, a correlation determining unit for receiving a phase difference signal representing a phase difference between a received carrier wave and a recovered carrier wave, and an output from the first adder, determining presence/absence of a correlation between the phase difference signal and the output, and outputting a control signal for controlling the sweep wave generator, a second adder for adding the output from the first adder to the phase difference signal, a digital-to-analog converter for receiving an output from the second adder, a loop filter for receiving an output from the digital-to-analog converter, and a voltage-controlled oscillator for receiving an output from the loop filter and generating the recovered carrier wave.

The correlation determining unit described in the basic aspect is constituted by a correlation detector and a pull-in determining unit, the correlation detector includes a first shift register and a third adder for receiving and smoothing the phase difference signal, a first flip-flop which operates upon reception of an output from the third adder at a N/2-frequency-divided clock input from the pull-in verification wave generator, a second flip-flop for receiving an output from the first flip-flop, a first subtracter for receiving both the output from the first flip-flop and an output from the second flip-flop, a third flip-flop which operates the output from the first adder at the N/2-frequency-divided clock input from the pull-in verification wave generator, a fourth flip-flop for receiving an output from the third flip-flop, a second subtracter for receiving both the output from the third flip-flop and an output from the fourth flip-flop, an exclusive OR (EX-OR) circuit for receiving both an output from the second subtracter and an output from the first subtracter, and a second shift register and a fourth adder for receiving outputs from the EX-OR circuit, and obtaining a correlation value by averaging output values in a predetermined period, and the pull-in determining unit includes a second subtracter for receiving and comparing the correlation value output from the fourth adder and a predetermined threshold value, wherein, when the correlation value exceeds the threshold value, a carrier wave recovery loop is determined to be in a phase-locked state, and when the correlation value is lower than the threshold value, the carrier wave recovery loop is determined to be in a phase-unlocked state.

It is also the characteristic aspect of the present invention that the verification wave generator described in the basic aspect generates a triangular wave.

As can be understood from the above aspects, the frequency sweep circuit of the present invention determines whether the loop is in the phase-locked state by detecting the presence of the negative-phase component of a pull-in verification wave in the phase difference signal by the correlation detector. If the loop is in the phase-unlocked state, the sweep wave generator is controlled to generate a sweep wave. In the phase-locked state, the current level is held. Only in the phase-unlocked state, the oscillation frequency is swept.

In the frequency sweep circuit of the present invention, since the main part of the circuit is constituted by a digital circuit, this circuit can be easily mounted on an IC, the oscillation condition is stabilized, and the degree of freedom for setting increases.

The above and many other advantages, features and additional objects of the present invention will become manifest to those versed in the art upon making reference to the following detailed description and accompanying drawings in which preferred embodiments incorporating the principles of the present invention are shown by way of illustrative example.

DETAILED DESCRIPTION OF PREFERRED EMBODIMENT

An embodiment of a frequency sweep circuit according to the present invention will be described below with reference to the accompanying drawings.

Figure 1:
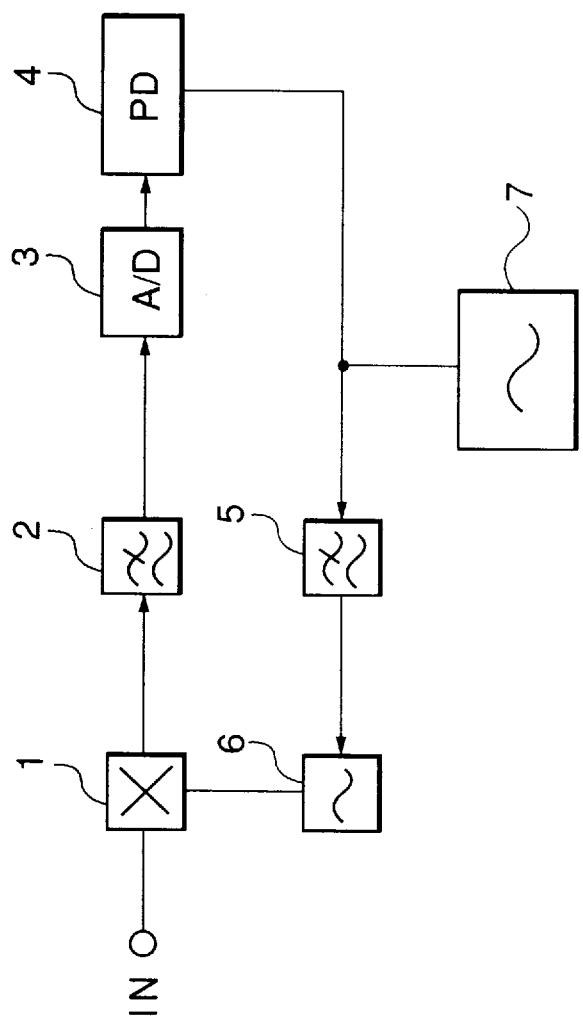
FIG. 1 is a block diagram showing the arrangement of a prior art.
Figure 2:
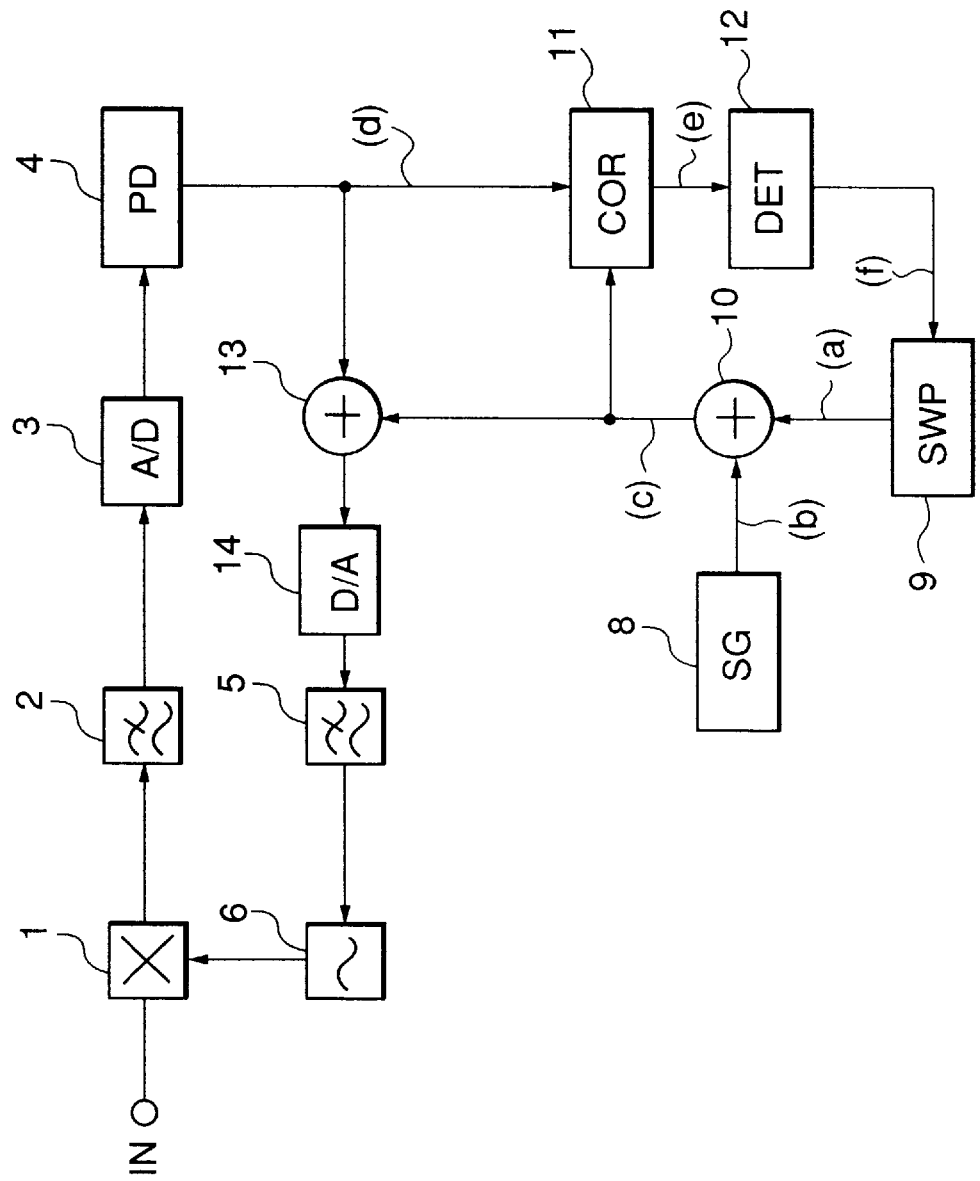
FIG. 2 is a block diagram showing the arrangement of an embodiment of the present invention.

FIG. 2 is a block diagram showing the arrangement of the embodiment according to the present invention. Reference numerals 1 to 6 in FIG. 2 denote the same constituent elements as those in the prior art. That is, this embodiment comprises a multiplier 1, a low-pass filter 2, an analog-to-digital (A/D) converter 3, a phase difference detector 4, a loop filter 5, and a voltage-controlled oscillator 6.

In addition to the above constituent elements, this embodiment comprises a pull-in verification wave generator 8, a sweep wave generator 9, a first adder 10, a correlation detector 11 and a pull-in determining unit 12 serving as a correlation determining unit, a second adder 13, and a digital-to-analog (D/A) converter 14.

After an output (b) from the pull-in verification wave generator 8 is added to an output (a) from the sweep wave generator 9 by the first adder 10, the resultant output is converted into an analog signal by the digital-to-analog converter 14. The output from the digital-to-analog converter 14 is changed to a control voltage for the voltage-controlled oscillator 6 via the loop filter 5.

An output (d) from the phase difference detector 4 is input to the correlation detector 11. The correlation detector 11 receives the output (d) from the phase difference detector 4 and an output (c) from the first adder 10 and detects a correlation between the two outputs to output a correlation value (e) to the pull-in determining unit 12. The pull-in determining unit 12 determines whether the carrier wave recovery loop is in the phase-locked or phase-unlocked state on the basis of the output (e) from the correlation detector 11, and outputs a control signal (f) to the sweep wave generator 9 on the basis of this result.

Next, the operation of the frequency sweep circuit shown in FIG. 2 will be explained. First, a digital pull-in verification wave signal (b) output from the pull-in verification wave generator 8 is inserted into the phase difference signal (d) as an output from the phase difference detector 4 via the first and second adders 10 and 13. At this time, the frequency of the verification wave signal (b) is lower than the band of the loop filter 5 and sufficiently lower than the sampling rate of the phase difference detector 4. In addition, the amplitude is also sufficiently smaller than the output signal (d) from the phase difference detector 4.

Although the waveform of the verification wave signal (b) under these conditions is arbitrarily set, the verification wave signal (b) is a triangular wave for descriptive convenience. The sweep wave signal (a) at this time has an amplitude sufficiently larger than the output (d) from the phase difference detector 4, and a frequency lower than the pull-in verification wave signal (b).

Figure 3A:
FIGS. 3A to 3F are charts showing waveforms at respective points in a circuit shown in FIG. 2.
Figure 3B:
Figure 3C:
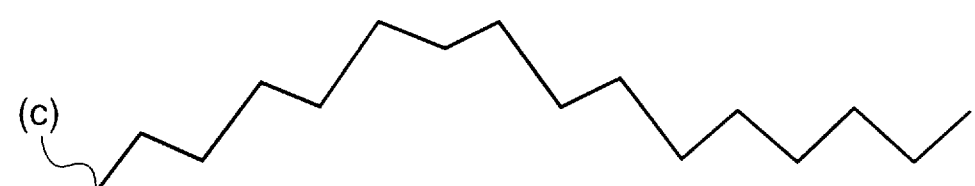
Figure 3D:
Figure 3E:
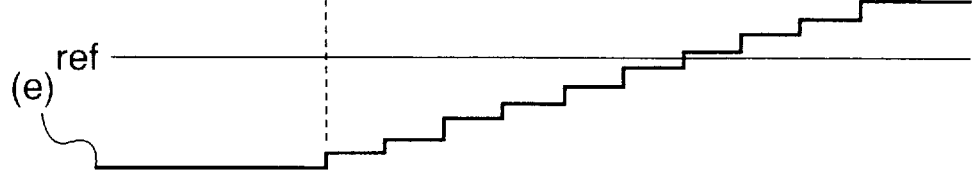
Figure 3F:

FIGS. 3A to 3F show waveforms at respective points. FIG. 3A shows the output (a) from the sweep wave generator 9, FIG. 3B shows the output (b) from the pull-in verification wave generator 8, FIG. 3C shows the output (c) from the first adder 10, FIG. 3D shows the smoothed output (d) from the phase difference detector 4, FIG. 3E shows the output (e) from the correlation detector 11, and FIG. 3F shows the output (f) from the pull-in determining unit 12.

If the carrier wave recovery loop is in the phase-locked state, the negative-phase component of the output from the first adder 10 appears in the phase difference signal (d) owing to the negative feedback operation of the phase-locked loop.

To the contrary, if the carrier wave recovery loop is in the phase-unlocked state, the negative feedback operation does not act, and no negative-phase component of the output from the first adder 10 appears in the phase difference signal (d) (see FIGS. 3C and 3D).

The correlation detector 11 detects the negative-phase component of the first adder 10 contained in the phase difference signal (d) by detecting a negative correlation between the phase difference signal (d) and the output (c) from the first adder 10 (see FIG. 3C). The pull-in determining unit 12 determines that the carrier wave recovery loop is in the phase-locked state when the correlation value (e) output from the correlation detector 11 exceeds a predetermined value (threshold value; see FIG. 3D).

Next, an operation upon determination will be explained.

When the carrier wave recovery loop is determined to be in the phase-unlocked state, the pull-in determining unit 12 causes the sweep wave generator 9 to generate the sweep wave signal (a). The sweep wave signal (a) is supplied to the voltage-controlled oscillator 6 via the first adder 10, the second adder 13, the digital-to-analog converter 14, and the loop filter 5, thereby widening the pull-in range of the carrier wave recovery loop which sweeps the oscillation frequency of the recovered carrier wave.

On the other hand, when the carrier wave recovery loop is determined to be in the phase-locked state, the pull-in determining unit 12 outputs a sweep stop signal to the sweep wave generator 9. In response to this sweep stop signal, the sweep wave generator 9 stops sweep and fixes the output level.

Figure 4:
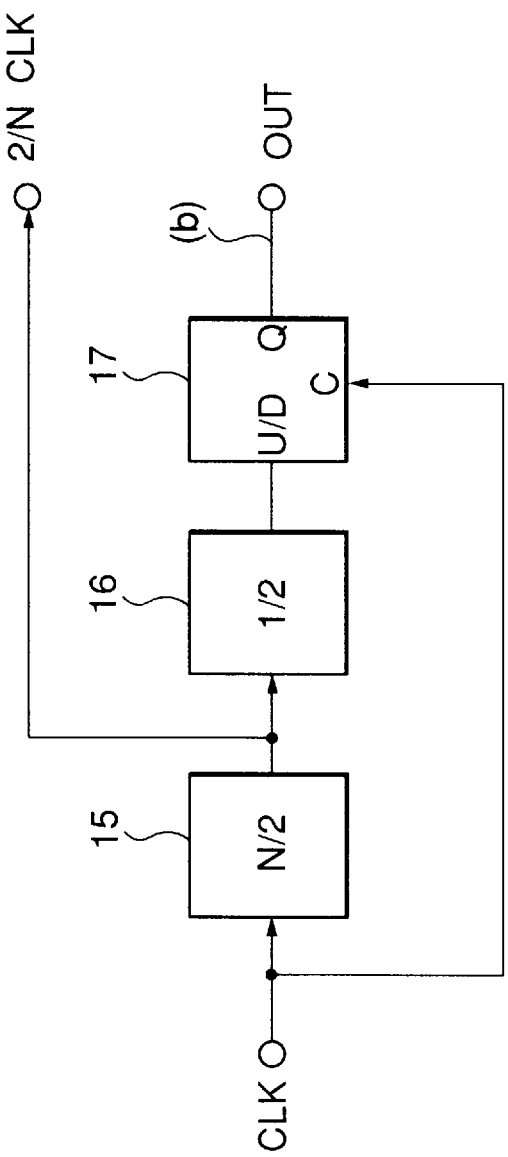
FIG. 4 is a circuit diagram showing a pull-in verification wave generator.

FIG. 4 shows an example of the pull-in verification generator 8. The pull-in verification wave generator 8 shown in FIG. 4 outputs a triangular wave having a period N times the reference clock output from the phase difference detector 4.

Figure 5:
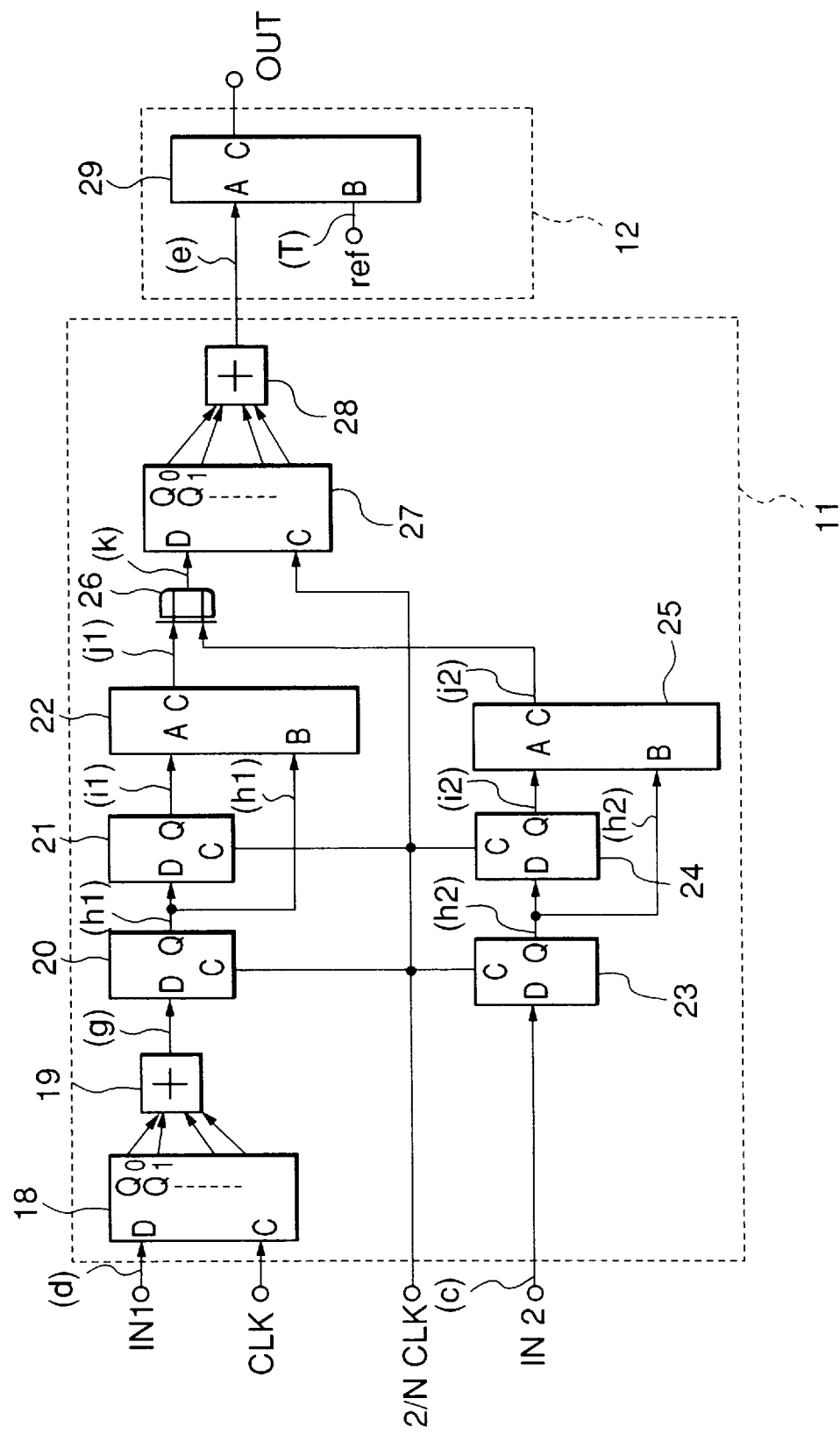
FIG. 5 is a circuit diagram showing a correlation detector and a pull-in determining unit.

FIG. 5 shows an example of the correlation detector 11 and the pull-in determining unit 12 serving as a correlation determining unit.

Referring to FIG. 5, the phase difference signal (d) input from IN1 is smoothed by a first shift register 18 and a third adder 19. A first flip-flop 20 operates upon reception of an output (g) on the path of the third adder 19 at an N/2-frequency-divided clock input from the pull-in verification wave generator 8. The first flip-flop 20 alternately samples the output (g) from the third adder 19 at the peak and valley of the pull-in verification wave (b). An output (hi) from the first flip-flop 20 is input to a first subtracter 22 and a second flip-flop 21. An output (i1) from the second flip-flop 21 is output to the first subtracter 22. Since the output (i1) from the second flip-flop 21 is delayed by a frequency divided at an N/2 clock with respect to the output from (h1) from the first flip-flop 20, an output (j1) from the first subtracter 22 represents an output difference between signals at the peak and valley of the pull-in verification wave (b).

Similarly, the output (c) from the first adder 10 input from IN2 is subtracted by a second subtracter 25 via flip-flops 23 and 24, and an output difference (j2) between signals at the peak and valley of the pull-in verification wave (b) is output from the second subtracter 25. When the phase is locked, and the negative feedback operation acts, outputs from the first and second subtracters 22 and 25 have a negative correlation therebetween. For this reason, the correlation between them can be detected by calculating the exclusive OR (EX-OR) of the positive and negative signals from the two subtracters. More specifically, if the correlation is present, an output (k) from an EX-OR circuit 26 is a positive value at a high probability. To the contrary, if no correlation is present, the output (k) from the EX-OR circuit 26 is positive or negative at an equal probability. Therefore, the correlation value (e) can be obtained by averaging the outputs (k) from the EX-OR circuit 26 in a predetermined period by a second shift register 27 and a fourth adder 28.

A subtracter 29 compares this correlation value (e) with a threshold value (T) set in advance. When the correlation value (e) exceeds the threshold value (T), the carrier wave recovery loop is determined to be in the phase-locked state; and when it is lower than the threshold value (T), it is determined to be in the phase-unlocked state.

What we claimed is:

1. A frequency sweep circuit used in a multisymbol modulator/demodulator for transmitting a digital signal, comprising:

a pull-in verification wage generator for generating a verification signal for pull-in verification;

a sweep wave generator for generating a frequency sweep signal;

a first adder for adding an output from said pull-in verification wave generator and an output from said sweep wave generator;

a correlation determining unit for receiving a phase difference signal representing a phase difference between a received carrier wave and a recovered carrier wave, and an output from said first adder, wherein said correlation determining unit comprises correlation detecting means for detecting correlation between said phase difference signal and said output from said first adder and outputting a correlation value and pull-in determining means for receiving said correlation value and determining phase-locked state and outputting a control signal to said sweep wave generator;

a second adder for adding the output from said first adder to the phase difference signal;

a digital-to-analog converter for receiving an output from said second adder;

a loop filter for receiving an output from said digital-to-analog converter; and a voltage-controlled oscillator for receiving an output from said loop filter and generating the recovered carrier wave.

2. A frequency sweep circuit used in a multisymbol modulator/demodulator for transmitting a digital signal, comprising:

a pull-in verification wage generator for generating a verification signal for pull-in verification;

a sweep wave generator for generating a frequency sweep signal;

a first adder for adding an output from said pull-in verification wave generator and an output from said sweep wave generator;

a correlation determining unit for receiving a phase difference signal representing a phase difference between a received carrier wave and a recovered carrier wave, and an output from said first adder, determining presence/absence of a correlation between the phase difference signal and the output, and outputting a control signal for controlling said sweep wave generator;

a second adder for adding the output from said first adder to the phase difference signal;

a digital-to-analog converter for receiving an output from said second adder;

a loop filter for receiving an output from said digital-to-analog converter; and a voltage-controlled oscillator for receiving an output from said loop filter and generating the recovered carrier wave, said correlation determining unit comprising a correlation detector and a pull-in determining unit, wherein said correlation detector includes a first shift register and a third adder for receiving and smoothing the phase difference signal, a first flip-flop which operates upon reception of an output from said third adder at a N/2-frequency-divided clock input from said pull-in verification wave generator, a second flip-flop for receiving an output from said first flip-flop, a first subtracter for receiving both the output from said first flip-flop and an output from said second flip-flop, a third flip-flop which operates the output from said first adder at the N/2-frequency-divided clock input from said pull-in verification wave generator, a fourth flip-flop for receiving an output from said third flip-flop, a second subtracter for receiving both the output from said third flip-flop and an output from said fourth flip-flop, an EX-OR circuit for receiving both an output from said second subtracter, and a second shift register and a fourth adder for receiving outputs from said EX-OR circuit, and obtaining a correlation value by averaging output values in a predetermined period, whereby said pull-in determining unit includes a second subtracter for receiving and comparing the correlation value output from said fourth adder and a predetermined threshold value, and, wherein, when the correlation value exceeds the threshold value, a carrier wave recovery loop is determined to be in a phase-locked state, and when the correlation value is lower than the threshold value, the carrier wave recovery loop is determined to be in a phase-unlocked state.

3. A circuit according to claim 2, wherein said pull-in verification wave generator generates a triangular wave.

4. A circuit according to claim 1, wherein said frequency sweep circuit includes a phase difference detector and said pull-in wave verification wave generator includes means for generating a wave having a period N times a reference clock output from said phase detector.

5. A frequency sweep circuit according to claim 2, wherein said circuit includes a phase difference detector and said pull-in wave verification wave generator includes means for generating a wave having a period N times a reference clock output from said phase detector.

6. A frequency sweep circuit according to claim 1, wherein said pull-in wave verification wave generator generates a N/2 frequency divided clock output, said N/2 frequency divided clock output is input to said correlation detecting means.

7. A frequency sweep circuit according to claim 2, wherein said pull-in wave verification wave generator generates a N/2 frequency divided clock output, said N/2 frequency divided clock output is input to said correlation detector.

* * * * *